(12) United States Patent
Xu

(10) Patent No.: US 9,025,326 B1
(45) Date of Patent: May 5, 2015

(54) SERVER

(71) Applicants: Inventec (Pudong) Technology Corporation, Shanghai (CN); Inventec Corporation, Taipei (TW)

(72) Inventor: Ji-Peng Xu, Shanghai (CN)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 0 days.

(21) Appl. No.: 14/187,515

(22) Filed: Feb. 24, 2014

(30) Foreign Application Priority Data

Dec. 20, 2013 (CN) .......................... 2013 1 0714170

(51) Int. Cl.
*H05K 5/00* (2006.01)
*H05K 7/00* (2006.01)
*H05K 7/14* (2006.01)

(52) U.S. Cl.
CPC .................................... *H05K 7/1487* (2013.01)

(58) Field of Classification Search
CPC .......... G06F 1/187; G06F 1/20; H05K 7/1487
USPC ............... 361/679.01–679.09, 679.1–679.19, 361/679.21–679.29, 679.31–679.45, 361/679.55–679.6, 724–747; 248/917–924, 248/80–88, 155.1–155.5, 166–173, 248/180.1–186.2, 229.1–231.51, 271.4, 248/292.14, 316.1–316.8; 369/75.1, 75.2, 369/75.11, 75.21, 76, 77.11, 77.21, 78, 79, 369/80, 81, 82

See application file for complete search history.

(56) References Cited

U.S. PATENT DOCUMENTS

2011/0043994 A1* 2/2011 Cheng et al. ............. 361/679.33

* cited by examiner

*Primary Examiner* — Jerry Wu
(74) *Attorney, Agent, or Firm* — Huffman Law Group, PC

(57) ABSTRACT

A server includes a server host including a tray, a main circuit, a left circuit board, a right circuit board, a rear circuit board, several first hard disk drives, several second hard disk drives and several third hard disk drives. The left, right and rear circuit boards are located at the left side, right side and rear side of the main circuit board, respectively, and all electrically connected to the main circuit board. The first hard disk drives are electrically connected to the main circuit board via the left and right circuit boards. The second hard disk drives are located at the left and right side of the rear circuit board. The third hard disk drives are located above the rear circuit board, and the second and third hard disk drives are electrically connected to the main circuit board via the rear circuit board.

11 Claims, 10 Drawing Sheets

US 9,025,326 B1

SERVER

CROSS-REFERENCE TO RELATED APPLICATIONS

This non-provisional application claims priority under 35 U.S.C. §119(a) on Patent Application No(s). 201310714170.1 filed in China on Dec. 20, 2013, the entire contents of which are hereby incorporated by reference.

BACKGROUND OF THE INVENTION

1. Technical Field of the Invention

The disclosure relates to an electronic device, and more particularly to a server.

2. Description of the Related Art

Nowadays, people live in the era of highly developed information technology. Not only enterprises but also human beings are all using personal computers (such as desktop computers or laptop computers) to do daily chores. With the improvement of telecommunication technology, the business model of conventional regionalism has been gradually replaced by international e-business. Thus, conventional personal computers may not satisfy the demand for enterprises. So, a computer manufacturer develops different kinds of servers (such as rack type servers, blade type servers or upright servers) in order to solve the problem of international e-business of enterprises.

Take the rack type server as an example. The rack type server comprises a rack and several server hosts mounted therein. This kind of server not only saves space and is easy to manage, but also coordinates several servers to work together to execute a large amount of data. However, assemblers usually need a great deal of time to mount several hard disk drives on the server host. Therefore, the structure needs to be improved for convenience of assembly and disassembly.

SUMMARY OF THE INVENTION

According to an embodiment, a server comprises at least one server host. The server host comprises a tray, a main circuit, a left circuit board, a right circuit board, a rear circuit board, a plurality of first hard disk drives, a plurality of second hard disk drives and a plurality of third hard disk drives. The main circuit board is mounted on the tray. A central processing unit is mounted on the main circuit board. The left circuit board is mounted on the tray, located at the left side of the main circuit board, and electrically connected to the main circuit board. The right circuit board is mounted on the tray, located at the right side of the main circuit board, and electrically connected to the main circuit board. The rear circuit board is mounted on the tray, located at the rear side of the main circuit board, and electrically connected to the main circuit board. The plurality of first hard disk drives are located at the left side and the right side of the main circuit board, respectively. The plurality of first hard disk drives located at the left side of the main circuit board are electrically connected to the main circuit board via the left circuit board. The plurality of first hard disk drives located at the right side of the main circuit board are electrically connected to the main circuit board via the right circuit board. The plurality of second hard disk drives are located at the left side and the right side of the rear circuit board, respectively. The plurality of second hard disk drives are electrically connected to the main circuit board via the rear circuit board. The plurality of third hard disk drives are located above on the rear circuit board, and the plurality of third hard disk drives are electrically connected to the main circuit board via the rear circuit board.

BRIEF DESCRIPTION OF THE DRAWINGS

The present disclosure will become more fully understood from the detailed description given hereinbelow, along with the accompanying drawings which are for illustration only, and thus are not limitative of the present disclosure, and wherein.

DETAILED DESCRIPTION

Figure 1:
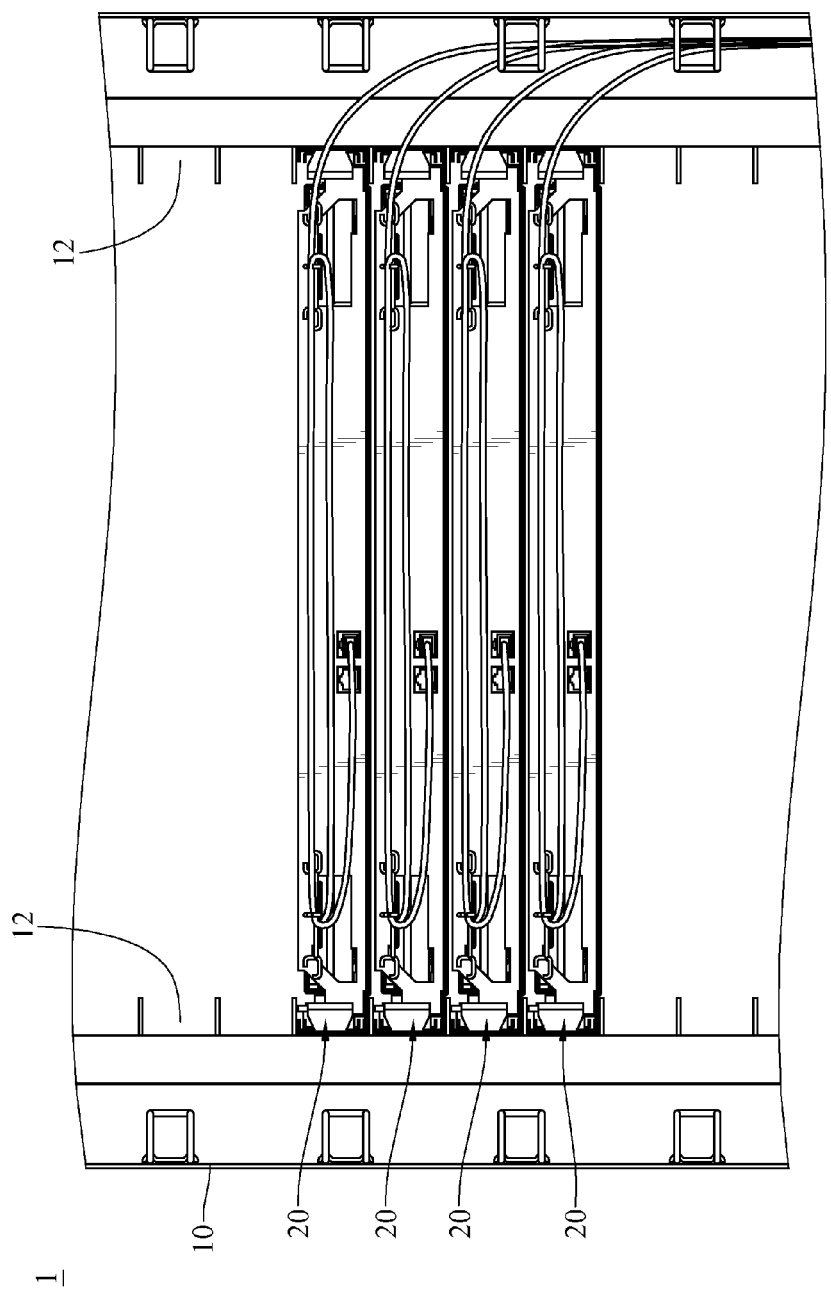
FIG. 1 is a partially front view of a server according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
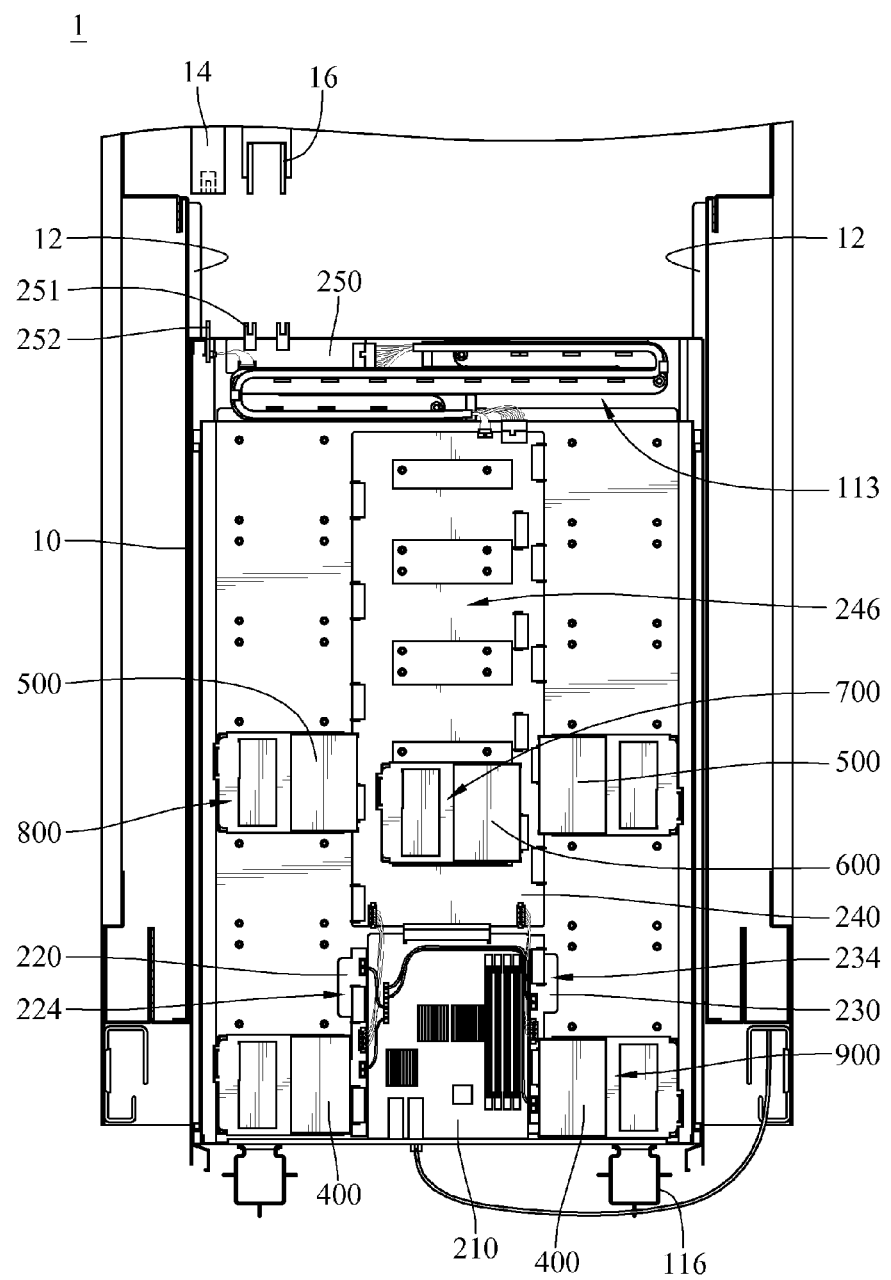
FIG. 2 is a top view of a server host being extracted from a rack in FIG. 1.
Figure 3:
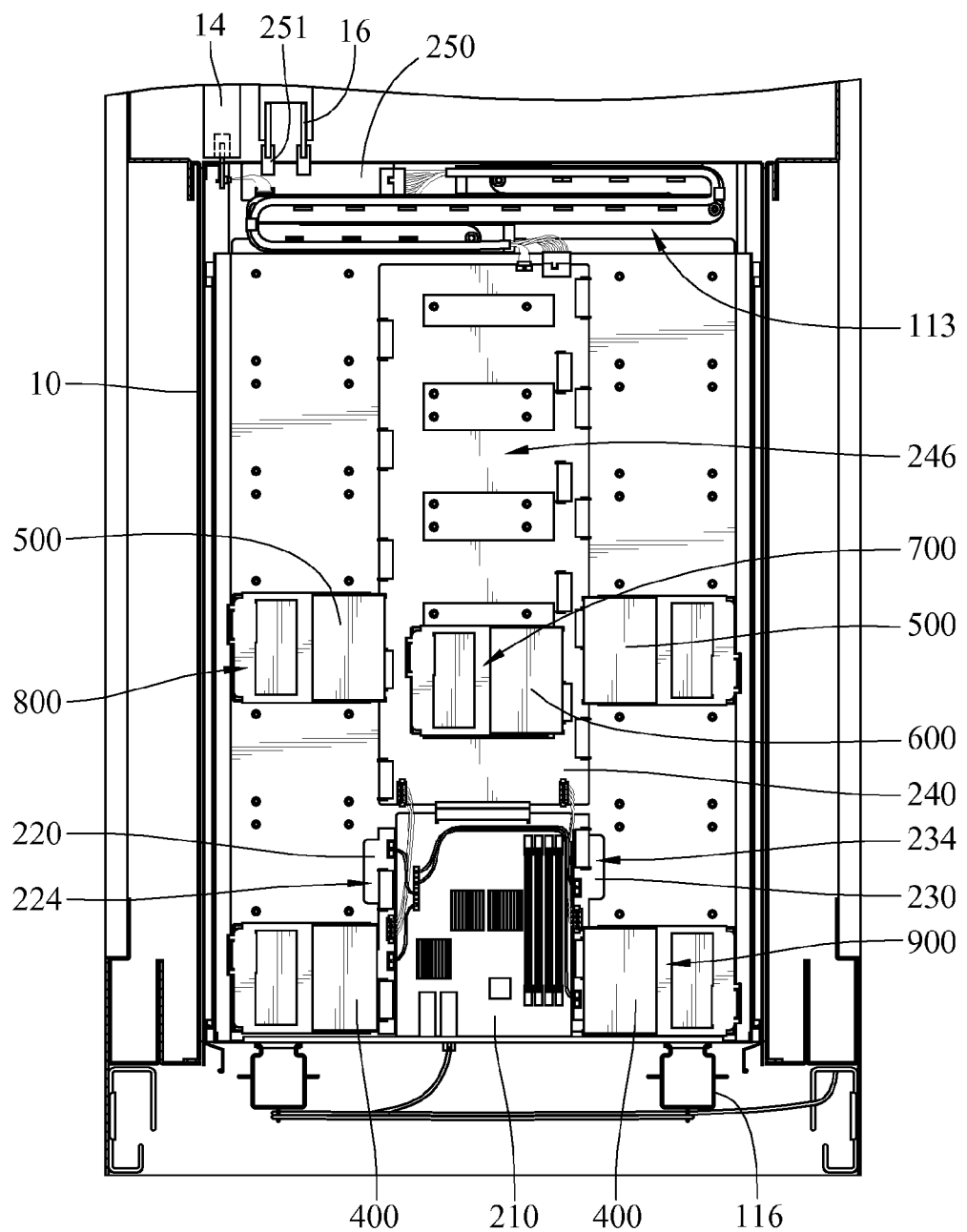
FIG. 3 is a top view of the server host being inserted into a rack in FIG. 1.

Please refer to FIGS. 1 to 3. FIG. 1 is a partially front view of a server according to an embodiment of the disclosure, FIG. 2 is a top view of a server host being extracted from a rack in FIG. 1, and FIG. 3 is a top view of the server host being inserted into a rack in FIG. 1. The server 1 is, for example, a rack type server 1. The server 1 comprises a rack 10 and a plurality of server host 20. The server 1 also comprises rails 12 located at the left side and the right side of the rack 10. The server host 20 may be extracted out (as shown in FIG. 2) or pushed into (as shown in FIG. 3) the rack 10 along the rails 12. A power supply pin 16 and a plurality of data transmission slot connectors 14 are located at the rear side of the rack 10. The data transmission slot connectors 14 are arranged from the bottom side towards the top side of the rack 10 in sequence and their positions each correspond to those of the rails 12.

Figure 4:
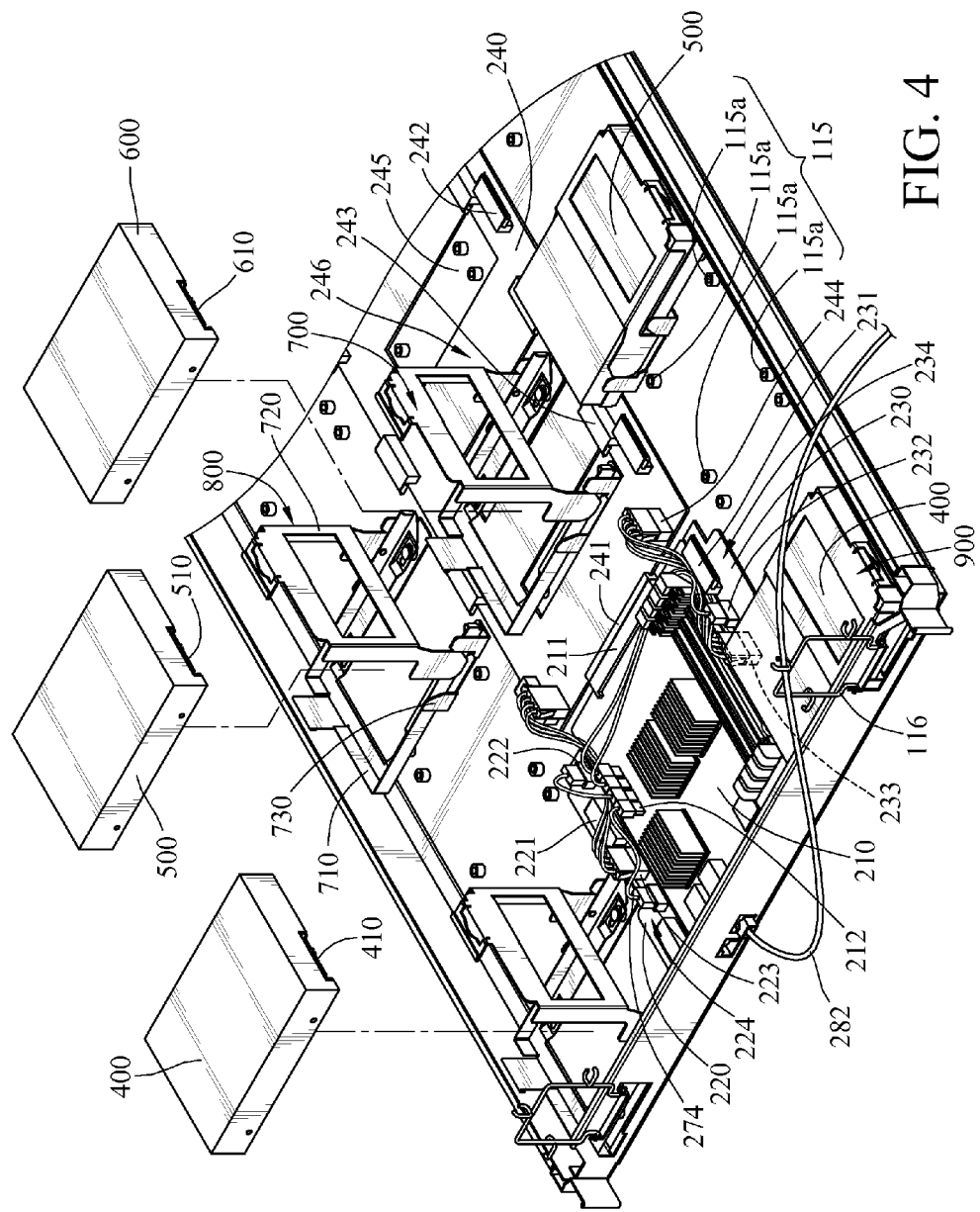
FIG. 4 is an exploded view of a portion of hard disk drives and circuit boards of the server host in FIG. 1.
Figure 5:
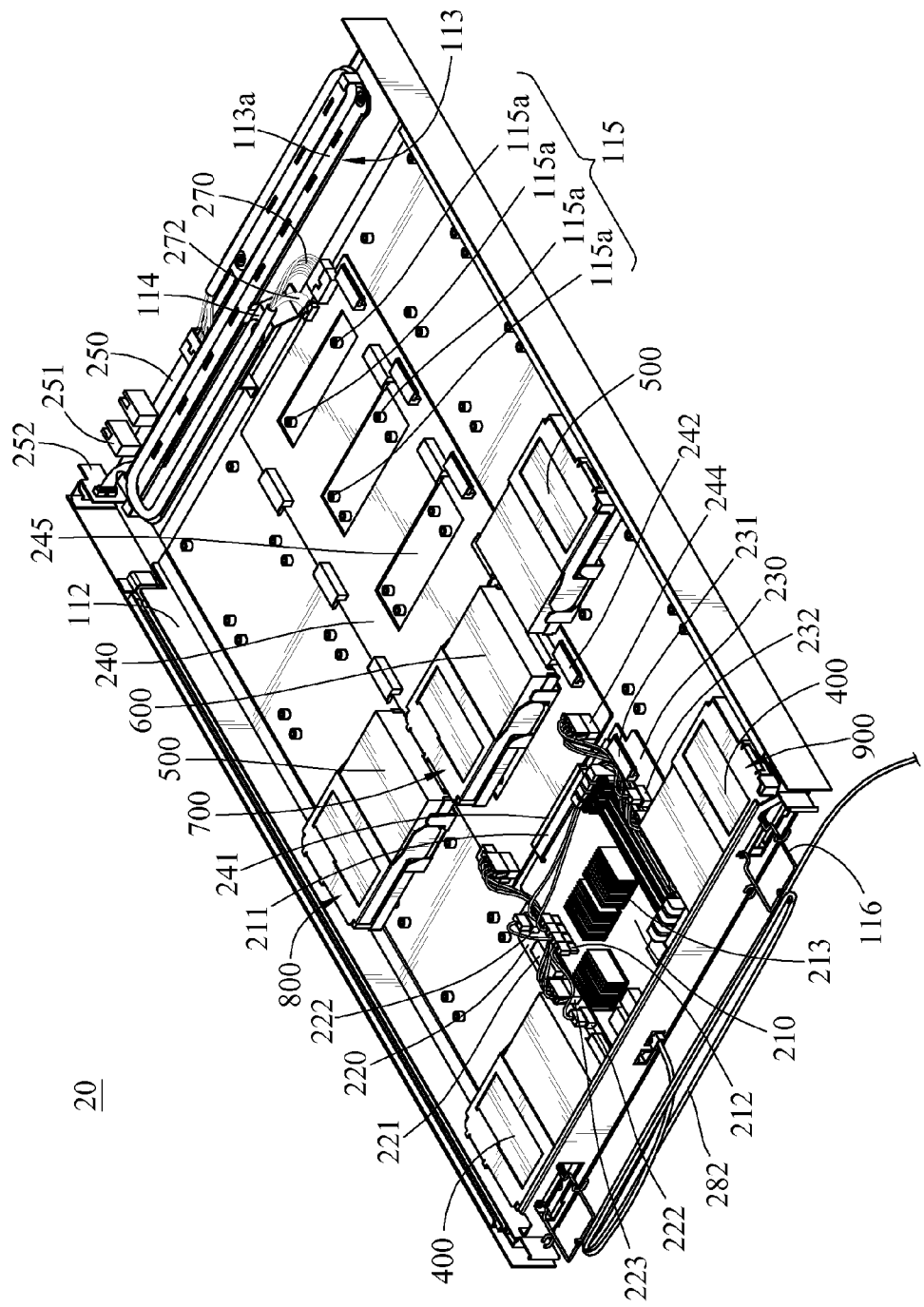
FIG. 5 is a perspective view of a second carrier being pushed to a first carrier in FIG. 3.
Figure 6:
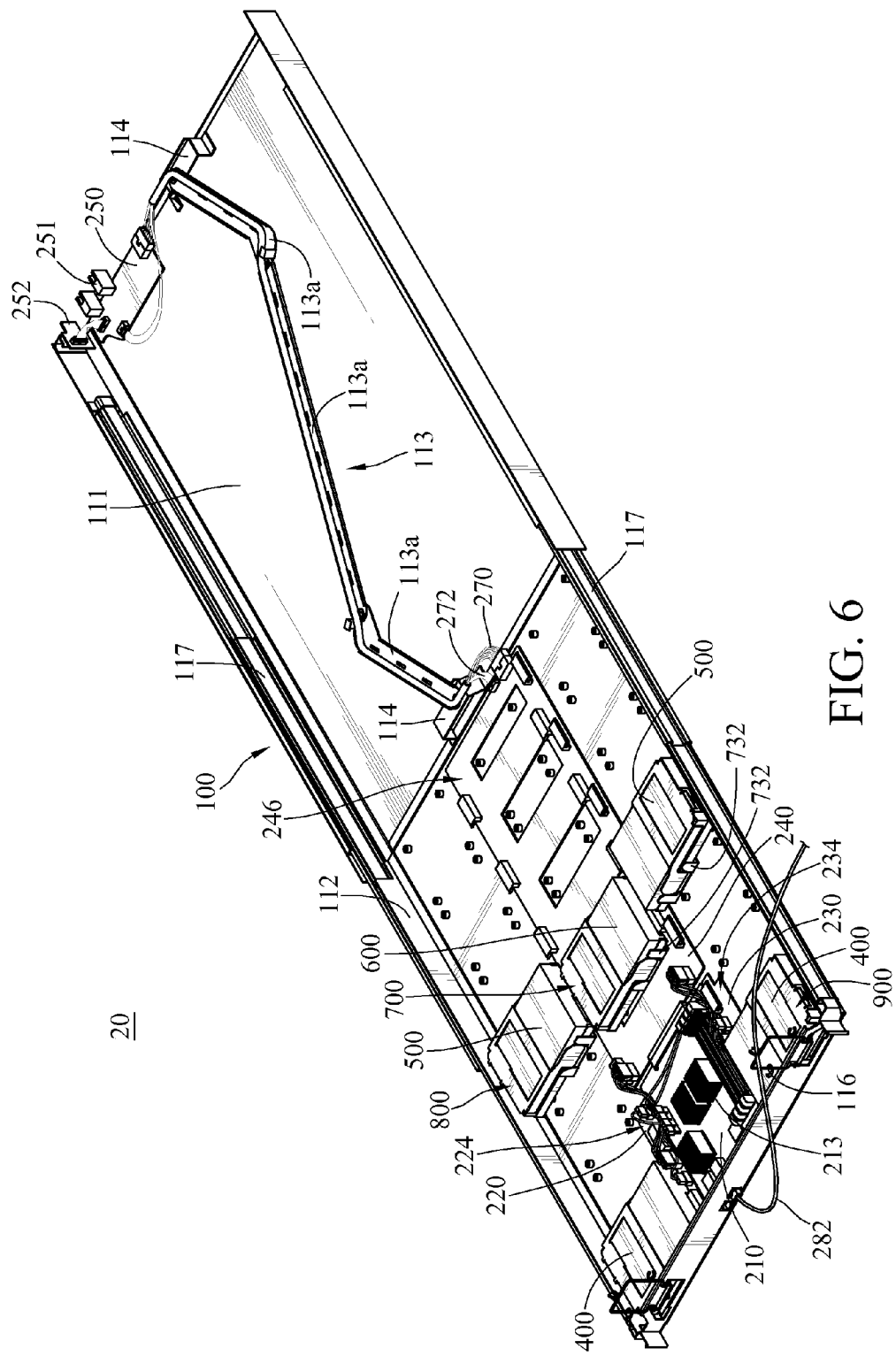
FIG. 6 is a perspective view of a second carrier being pulled from a first carrier in FIG. 3.

Please refer to FIGS. 2, 4, 5 and 6. FIG. 4 is an exploded view of a portion of hard disk drives and circuit boards of the server host in FIG. 1, FIG. 5 is a perspective view of a second carrier being pushed to a first carrier in FIG. 3, and FIG. 6 is a perspective view of a second carrier being pulled from a first carrier in FIG. 3. Each server host 20 comprises a tray 100, a plurality of circuit boards, a plurality of first hard disk drives 400, a plurality of second hard disk drives 500 and a plurality of third hard disk drives 600. These circuit boards, the first hard disk drive 400, the second hard disk drive 500 and the third hard disk drive 600 are all mounted on the tray 100.

Each tray 100 comprises a first carrier 111, a second carrier 112 and a pivotal cable management 113. The first carriers 111 are slidably locked on the two rails 12 corresponding to the two opposite sides of the rack 10 (as shown in FIG. 1), such that the first carriers 111 may divide the inner space of the rack 10 into a plurality of rooms from bottom to top. The second carrier 112 is slidably mounted on the first carrier 111. In this embodiment, two sliding rails 117 are mounted on two opposite sides of the tray 100 where the first carrier 111 and the second carrier 112 are in direct contact. Thus, it is easier to extract or insert the second carrier 112 with the two sliding rails 117.

The pivotal cable management 113 comprises a plurality of cable management rods 113a pivotally connected in series. An end of the pivotal cable management 113 is pivotally located on the first carrier 111 and another end of the pivotal cable management 113 is pivotally located on the second carrier 112. The second carrier 112 is adapted for slidably moving relative to the first carrier 111 to have an extended position and a compressed position. When the second carrier 112 is at the extended position, the second carrier 112 drives the cable management rods 113a to expand relatively with each other (as shown in FIG. 4). When the second carrier 112 is at the compressed position, the second carrier 112 drives the cable management rods 113a to close and relatively draw to each other (as shown in FIG. 5).

In this and some other embodiments, the tray 100 further comprises two supporting members 114. The two opposite ends of the supporting members 114 are affixed to the rear side of the first carrier 111, and the two opposite ends of the other supporting member 114 are affixed to the rear side of the second carrier 112. Moreover, the two opposite ends of the pivotal cable management 113 are pivotally located on two supporting members 114. That is to say, the two opposite ends of the pivotal cable management 113 are pivotally connected to the first carrier 111 and the second carrier 112 via the two supporting members 114, respectively, and the supporting members 114 may lift up the pivotal cable management 113, for preventing the pivotal cable management 113 from being in direct contact with the first carrier 111.

In this and some other embodiments, the server host 20 further comprises two cable managements 116 and at least one network cable 282. Each cable management 116 is pivotally located on the front side of the second carrier 112. The network cable 282 is plugged into the front side of the server host 20 to be electrically connected with the main circuit board 210. Referring to FIG. 3, when the second carrier 112 is at the compressed position (i.e., the second carrier 112 is located in the first carrier 111), the network cable 282 may be wound around the cable management 116, so the network cable 282 is well managed and avoids being tangled. As shown in FIG. 4, when the second carrier 112 is at the extended position (the second carrier 112 is pulled out from the first carrier 111), the network cable 282, which was wound around two cable managements 116, is released. When the second carrier 112 of the upper one of two of the server hosts 20 adjacent to each other is located in the first carrier 111 and the first carrier 11 is pulled out from the second carrier 112 of one of the two adjacent server hosts 20 at the lower position, the two cable managements 116 of the upper one of the two adjacent server hosts 20 are located above the second hard disk drives 500 of the lower one of the two adjacent server hosts 20, the network cable 282 of the upper one of the two adjacent server hosts 20 is wound around the two cable managements 116, and the cable managements 116 of the lower one of two server hosts 20 adjacent to each other are flipped over, such that the two cable managements 116 of the upper one of two server hosts 20 adjacent to each other do not interfere with the assembly and disassembly of the two of the second hard disk drives 500 of the lower one of two server hosts 20 adjacent to each other.

Figure 7:
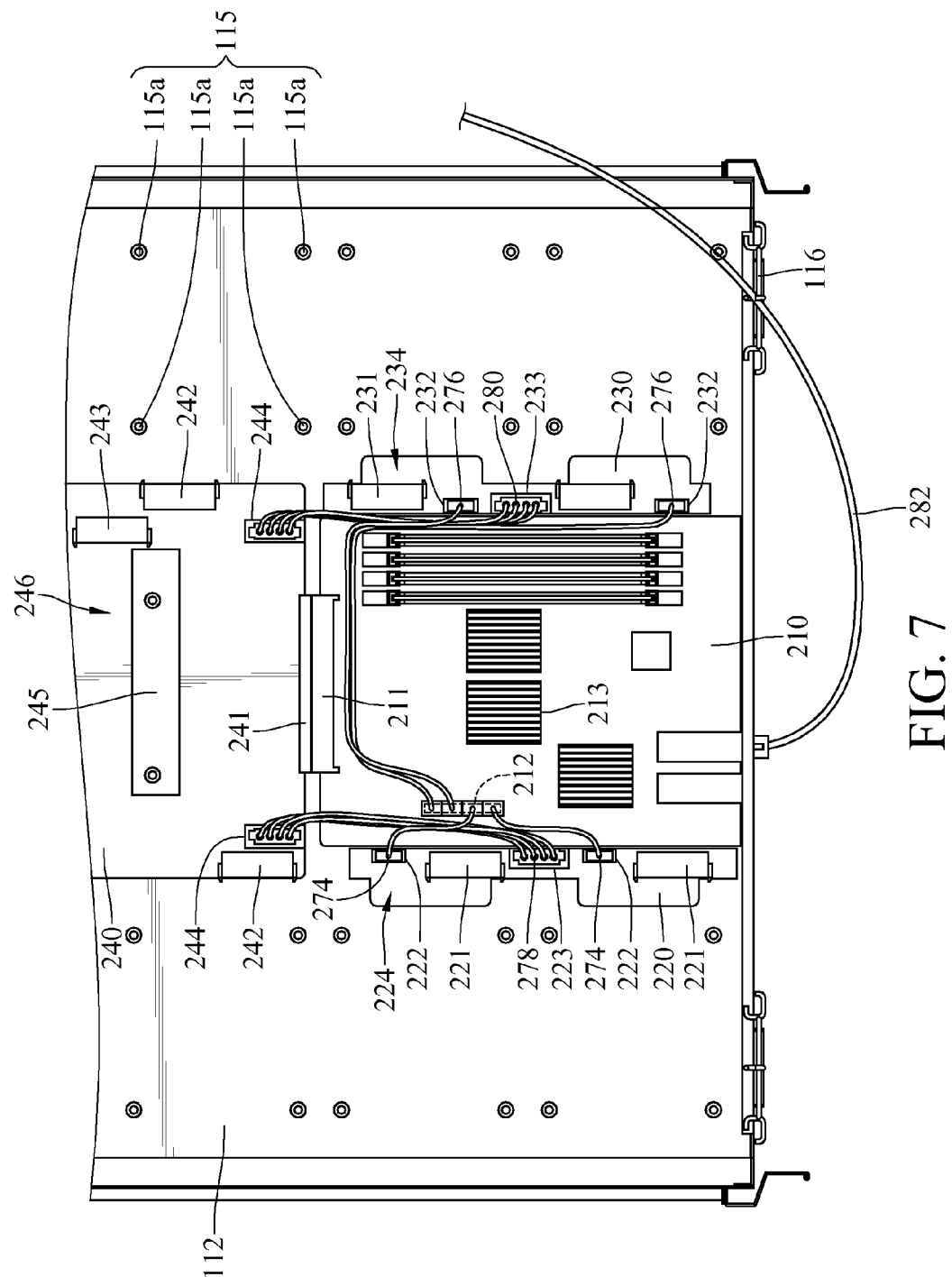
FIG. 7 is a partially plane view of the second carrier in FIG. 5.

Please refer to FIG. 7, which is a partially plane view of the second carrier in FIG. 5. The circuit boards are mounted on the tray 100 and comprise a main circuit board 210, a left circuit board 220, a right circuit board 230 and a rear circuit board 240. Some electronic components, such as a central processing unit 213 (CPU), a south bridge chip and a north bridge chip are located on the main circuit board 210. The left circuit board 220, the right circuit board 230 and the rear circuit board 240 are used for expansion of hard disk drives. (Namely, additional hard disk drives can be added to the server 1 for increasing the volume of data storage.) The left circuit board 220 is located at the left side of the main circuit board 210, the right circuit board 230 is located at the right side of the main circuit board 210, the rear circuit board 240 is located at the rear side of the main circuit board 210. The left circuit board 220, the right circuit board 230 and the rear circuit board 240 are electrically connected to the main circuit board 210, respectively. The first hard disk drives 400 are located at the left side of the left circuit board 220 and the right side of the right circuit board 230, respectively. Furthermore, the first hard disk drives 400 are electrically connected to the main circuit board 210 via the left circuit board 220 and the right circuit board 230. The second hard disk drives 500 are respectively located at the left side and the right side of the rear circuit board 240 and electrically connected to the main circuit board 210 via the rear circuit board 240. The third hard disk drives 600 are located above the rear circuit board 240 and electrically connected to the main circuit board 210 via the rear circuit board 240.

In this embodiment, the main circuit board 210, the left circuit board 220, the right circuit board 230 and the rear circuit board 240 are parallel to each other, and the circuit configurations of each circuit board are coplanar with each other. In this embodiment, "being coplanar with each other" means that the normal directions of the main circuit board 210, the left circuit board 220, the right circuit board 230 and the rear circuit board 240 are parallel to each other. Furthermore, the left side of the left circuit board 220 and the right side of the right circuit board 230 include a plurality of first connectors 221 and 231, respectively. Each first hard disk drive 400 includes a second connector 410. The first hard disk drives 400 are directly inserted into (namely, without any connection via cable) the first connectors 221 and 231 along a direction heading toward the main circuit board 210 via the second connector 410. The left side and the right side of the rear circuit board 240 include a plurality of third connectors 242. Each second hard disk drive 500 includes a fourth connector 510. The second hard disk drives 500 are directly inserted into (namely, without any connection via cable) the third connectors 242 along a direction heading toward the rear circuit board 240 via the fourth connector 510. The left side of the right side of the rear circuit board 240 includes a plurality of fifth connectors 243 arranged in line. The third connectors 242 located at the left side of the rear circuit board 240 are arranged in line, and the third connectors 242 located at the right side of the rear circuit board 240 are arranged in line, and the fifth connectors 243 are located between the third connectors 242 located at the left side of the rear circuit board 240 and the third connector 242 located at the right side of the rear circuit board 240. In this embodiment, the fifth connector 243 are located at the right side of the rear circuit board 240, and the fifth connector 243 and the third connector 242 located at the right side of the rear circuit board 240 are staggered. In other embodiments, these fifth connectors 243 are located at the left side of the rear circuit board 240, and the fifth connectors 243 and the third connectors 242 located at the left side of the rear circuit board 240 are staggered. Each third hard disk drive 600 includes a sixth connector 610. These third hard disk drives 600 are directly inserted into (namely, without any connection via cable) the fifth connectors 243 via the sixth connectors 610.

It should be noted that each connector of the hard disk drives is directly inserted into each connector of the circuit boards without any cable wire, which reduces the cost of cable wire, saves space and does not need to manage the cable wire. However, the disclosure is not limited thereto. In other embodiments, each connector of the hard disk drives is electrically connected to the connectors of the circuit boards via cable wires.

Furthermore, the left circuit board 220, the right circuit board 230 and the rear circuit board 240 are parallel to each other. The first connectors 221 are mounted on an upper surface 224 of the left circuit board 220, the third connectors 242 are mounted on an upper surface 234 of the right circuit board 230, the fifth connectors 243 are mounted on an upper surface 246 of the rear circuit board 240, and these upper surfaces 224, 234 and 246 are coplanar with each other. The first connectors 221, the third connectors 242 and the fifth connectors 243 are at the same horizontal height, thereby keeping the first hard disk drives 400, the second hard disk drives 500 and the third hard disk drives 600 at the same horizontal height as well. The horizontal height in this disclosure is measured from the ground on which the server 1 is located towards the object.

In this disclosure, the first connectors 221 located at the left side of the left circuit board 220 and the second connectors 410 at the left side of the rear circuit board 240 are arranged in line. In detail, the first connectors 221 located at the left side of the left circuit board 220 and the second connectors 410 at the left side of the rear circuit board 240 are located at the same line and each interface of the connectors faces the same direction. Similarly, the first connectors 221 located at the right side of the right circuit board 230 and the third connectors 242 located at the right side of the rear circuit board 240 are arranged in line. Thus, the above-mentioned configuration provides residual space for additionally having the first hard disk drives 400 located at the left side of the main circuit board 210 and the second hard disk drives 500 located at the left side of the rear circuit board 240 being arranged side by side. Also, the above-mentioned configuration provides residual space for the first hard disk drives 400 at the right side of the main circuit board 210 and the second hard disk drive 500 located at the right side of the first hard disk drive 400 being arranged side by side.

The main circuit board 210 includes a slot connector 211, and the rear circuit board 240 includes a metal pin connector 241 compatible with the slot connector 211. The metal pin connector 241 is detachably inserted into the slot connector 211, such that the main circuit board 210 and the rear circuit board 240 may be electrically connected with each other. In this embodiment, the metal pin connector 241 is mounted on the rear circuit board 240, the slot connector 211 is mounted on the main circuit board 210, but the disclosure is not limited thereto. In other embodiments, the metal pin connector 241 is mounted on the main circuit board 210, and the slot connector 211 is mounted on the rear circuit board 240.

Figure 8:
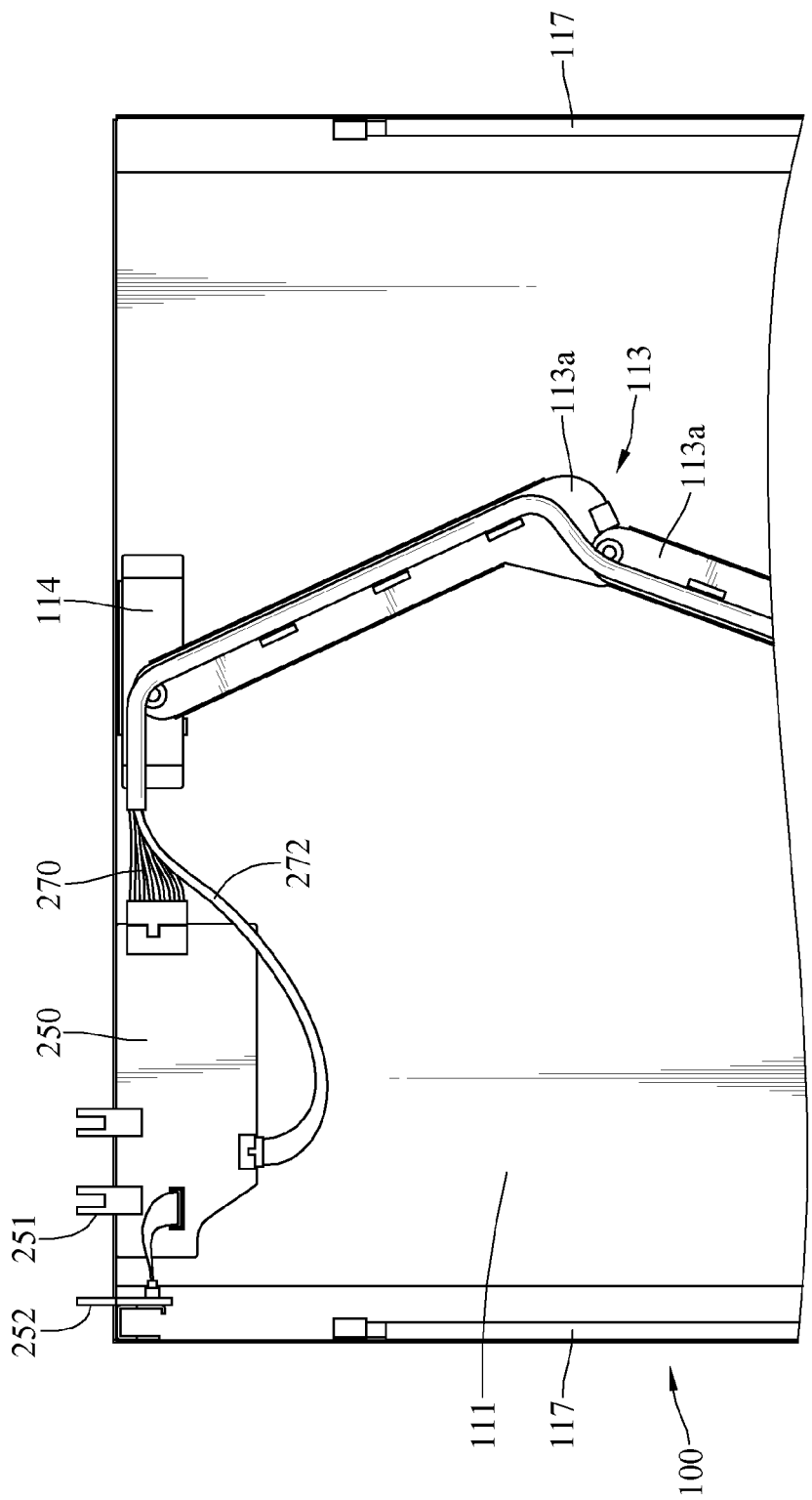
FIG. 8 is a partially plane view of a first carrier and an adapter circuit board in FIG. 5.

Please refer to FIG. 8, which is a partially plane view of a first carrier and an adapter circuit board in FIG. 5. Each server host 20 further comprises an adapter circuit board 250, at least one data and signal transmission cable 270 and at least one power cable 272. The adapter circuit board 250 is mounted on a side of the first carrier 111 near the rear side of the rack 10.

The data and signal transmission cable 270 and the power cable 272 are secured in the cable management rods 113a, and the two opposite ends of the data and signal transmission cable 270 and the two opposite ends of the power cable 272 are electrically connected to the rear circuit board 240 and the adapter circuit board 250, respectively. Moreover, the adapter circuit board 250 includes a power plug 251 and a data transmission plug 252. The power plug 251 is electrically connected to the power cable 272 via the adapter circuit board 250, and the data transmission plug 252 is electrically connected to the data and signal transmission cable 270 via the adapter circuit board 250. When the first carrier 111 is positioned in the rack 10, the power plug 251 is in contact and electrically connected with power supply pin 16, and the data transmission plug 252 is inserted into the corresponding data transmission slot connector 14. Therefore, during the process of the second carrier 112 slidably moving relative to the first carrier 111, the data and signal transmission cable 270 and the power cable 272 may be expanded according to the expansion of the pivotal cable management 113. Since the data and signal transmission cable 270 and the power cable 272 are still electrically connected to a power supply (not shown) and data processing unit (not shown) of the server 1 during the process, the signal transmissions of the data and signal transmission cable 270 and the power cable 272 are uninterruptible. Therefore, during the disassembly process of hard disk drive, the first hard disk drives 400, the second hard disk drives 500 and the third hard disk drives 600 are plug-and-play (PnP). In other words, when some of the hard disk drives need to be replaced, only the replaced hard disk drive can not operate, other hard disk drives may operate normally, which do not affect the operation of the server 1. In this disclosure, the plug-and-play is an ability of a computer to detect and configure a new piece of hardware (i.e., the first hard disk drives 400, the second hard disk drives 500 and the third hard disk drives 600) automatically, without the requirement of the user to physically configure and set the hardware device with jumpers or dip switches.

The server host 20 further comprises a first data transmission cable 274, at least one second data transmission cable 276, at least one first power cable 278 and at least one second power cable 280. The two opposite ends of the first data transmission cable 274 are electrically connected to the main circuit board 210 and the left circuit board 220, respectively, for transmitting data between the first hard disk drives 400 connected to the left circuit board 220 and the main circuit board 210. The two opposite ends of the first power cable 278 are electrically connected to the left circuit board 220 and the rear circuit board 240, respectively, for transferring power between the first hard disk drives 400 located on the left circuit board 220 and the main circuit board 210. The two opposite ends of the second data transmission cable 276 are electrically connected to the main circuit board 210 and the right circuit board 230, respectively, for transmitting data between the first hard disk drives 400 respectively located on the right circuit board 230 and the main circuit board 210. The two opposite ends of the second power cable 280 are electrically connected to the right circuit board 230 and the rear circuit board 240, respectively, for transferring power (namely, electricity) between the first hard disk drives 400 located on the right circuit board 230 and the main circuit board 210.

In this embodiment, the main circuit board 210 includes a seventh connector 212, and the left circuit board 220 and the right circuit board 230 include eighth connectors 222 and 232, respectively. The two opposite ends of the first data transmission cable 274 are connected to the seventh connector 212 of the main circuit board 210 and the eighth connector 222 of the left circuit board 220, respectively. The two opposite ends of the second data transmission cable 276 are connected to the seventh connector 212 of the main circuit board 210 and the eighth connector 232 of the right circuit board 230, respectively.

Moreover, the rear circuit board 240 includes a ninth connector 244. The left circuit board 220 and the right circuit board 230 include tenth connectors 223 and 233, respectively. The two opposite ends of the first power cable 278 are connected to the ninth connector 244 of the rear circuit board 240 and the tenth connector 223 of the left circuit board 220, respectively. The two opposite ends of the second power cable 280 are connected to the ninth connector 244 of the rear circuit board 240 and the tenth connector 233 of the right circuit board 230, respectively.

Figure 9:
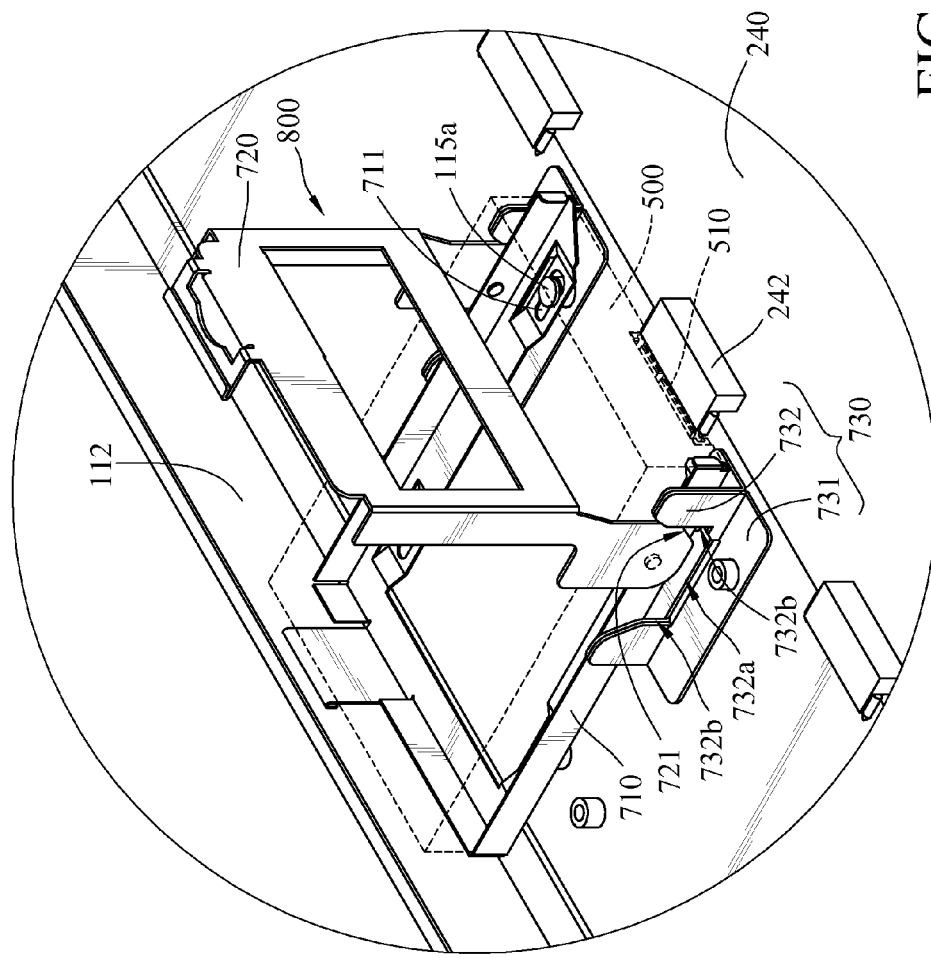
FIGS. 9 and 10 are views of assemblies of a second hard disk drive and a hard disk drive carrier corresponding to the second hard disk drive.
Figure 10:
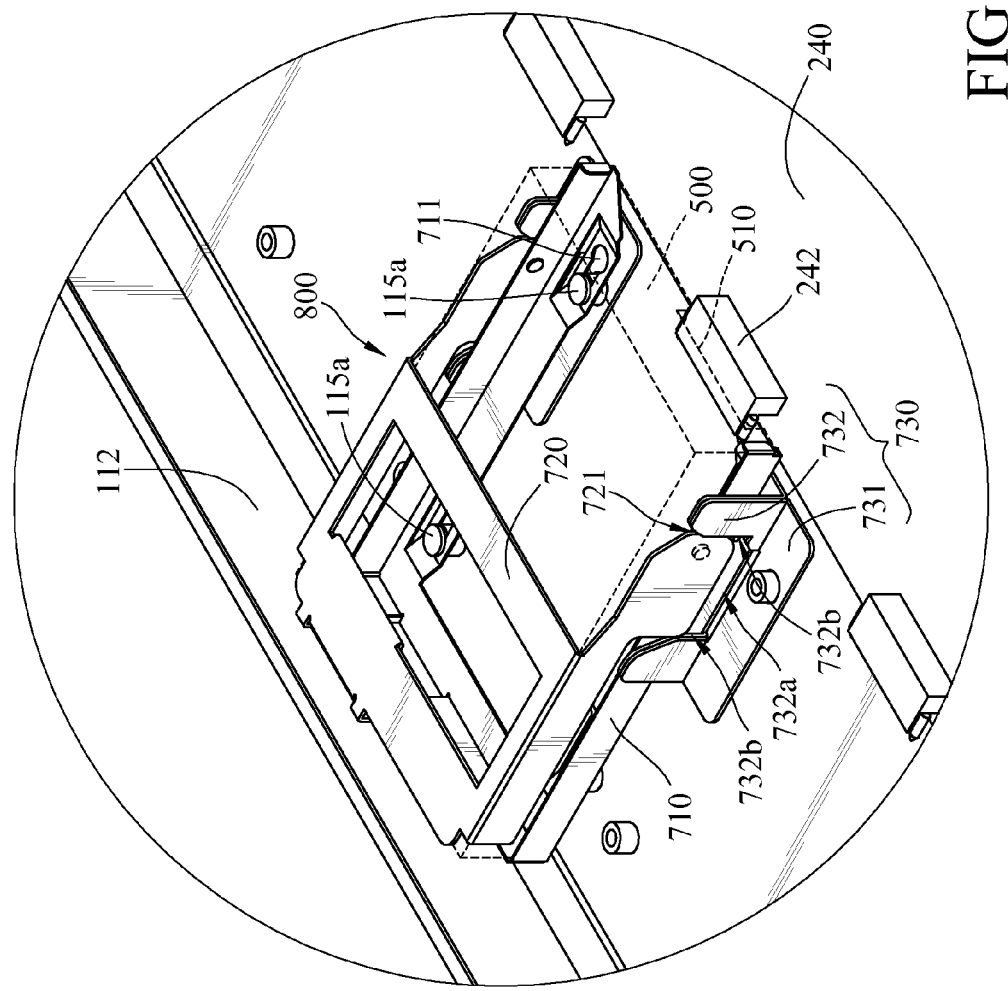

Please refer to FIGS. 5, 9 and 10. FIGS. 9 and 10 are views of assemblies of a second hard disk drive and a hard disk drive carrier corresponding to the second hard disk drive. The server host 20 in this embodiment further comprises a plurality of hard disk drive carriers 700 for carrying the third hard disk drives 600. Each third hard disk drive 600 is mounted on the second carrier 112 via the hard disk drive carrier 700, and is rapidly inserted into the rear circuit board 240 via the hard disk drive carrier 700. The server host 20 in this embodiment further comprises a plurality of hard disk drive carriers 800 for carrying the second hard disk drives 500 and a plurality of hard disk drive carriers 900 for carrying the first hard disk drives 400.

In this disclosure, the rear circuit board 240 includes a plurality of openings 245, and the second carrier 112 includes a plurality of assembly portions 115 corresponding to the hard disk drive carriers 700, 800 and 900, respectively. Each assembly portion 115 includes four assembly protrusions 115a located corresponding to the four corners of the hard disk drives. The assembly protrusions 115a corresponding to the hard disk drive carrier 700 pass through the openings 245 and are higher than the rear circuit board 240. In this embodiment, the four corners of the assembly portion 115 corresponding to the hard disk drive carrier 700 pass through the two adjacent openings 245. The above-mentioned hard disk drive carriers 700, 800 and 900 are slidably mounted on the corresponding assembly portions 115. Each first hard disk drive 400, each second hard disk drive 500 and each third hard disk drive 600 are mounted on the second carrier 112 with the hard disk drive carriers 700, 800 and 900.

Each hard disk drive carrier 700, 800 and 900 comprises a limiting member 730, a supporting frame 710 and a cover 720. The limiting member 730 comprises a bottom plate 731 and a lateral plate 732. The bottom plate 731 is affixed to the second carrier 112. The lateral plate 732 is connected to a side of the bottom plate 731, and the lateral plate 732 includes a recess 732a and two limiting surfaces 732b located at the surface forming the recess 732a. The two limiting surfaces 732b are separated from the rear circuit board 240 by different surfaces. In this embodiment, the lateral plates 732 of the two limiting members 730 of the two adjacent hard disk drive carriers 700 are arranged side by side, and a portion of the assembly protrusion 115a penetrates the bottom plate 731 of the limiting member 730. The lateral plates 732 of the limiting members 730 of each hard disk drive carrier 700 pass through the corresponding openings 245. Each supporting frame 710 includes a plurality of assembly slots 711. The assembly slots 711 are adapted for slidably moving relative to the assembly protrusions 115a to be mounted on the assembly protrusion 115a. The cover 720 is pivotally located on the supporting frame 710. The cover 720 has a curved surface 721. When the cover 720 expands relative to the supporting frame 710 (as shown in FIG. 9), a side of the curved surface 721 is leaned against the limiting surface 732b nearer the rear circuit board 240, so as to drive the supporting frame 710 to slidably move away from the rear circuit board 240. When the cover 720 is moved towards the supporting frame 710, another side of the curved surface 721 is leaned against the limiting surface 732b farther away from the rear circuit board 240, so as to drive the supporting frame 710 to slidably move along a direction heading toward the rear circuit board 240 (as shown in FIG. 10) as well as to drive the connectors of the hard disk drives to insert into the connectors of each circuit board.

In the server according to the disclosure, the configuration of the inner space of the server is improved by the configurations of the main circuit board, the left circuit board, the right circuit board and the rear circuit board, and the configuration relationships between the first hard disk drives, the second hard disk drives and the third hard disk drives and the circuit boards, and therefore, each server host may contain the maximum amount of hard disk drives.

Moreover, the configurations between the main circuit board, the left circuit board, the right circuit board and the rear circuit board and the configuration relationships between the first hard disk drives, the second hard disk drives and the third hard disk drives and the circuit board may enhance the convenience of the assembly of the server.

Furthermore, the slidable hard disk drive carrier is easier for an assembler to mount and electrically connect the hard disk drives in the server host in a narrow and limited space.

What is claimed is:
1. A server, comprising at least one server host, the server host comprising:
   a tray;
   a main circuit board mounted on the tray, a central processing unit mounted on the main circuit board, the main circuit board having a left side, a right side and a rear side;
   a left circuit board mounted on the tray, located at the left side of the main circuit board, and electrically connected to the main circuit board;
   a right circuit board mounted on the tray, located at the fight side of the main circuit 10 board, and electrically connected to the main circuit board;
   a rear circuit board mounted on the tray, located at the rear side of the main circuit board, and electrically connected to the main circuit board;
   a plurality of first hard disk drives located at the left side and the right side of the main circuit board, respectively, wherein the first hard disk drives located at the left side of the main circuit board are electrically connected to the main circuit board via the left circuit board, and the first hard disk drives located at the fight side of the main circuit board are electrically connected to the main circuit board via the fight circuit board;
   a plurality of second hard disk drives located at a left side and a right side of the rear circuit board, respectively, wherein the plurality of second hard disk drives are electrically connected to the main circuit board via the rear circuit board and arranged in line with the plurality of first hard disk drives respectively; and
   a plurality of third hard disk drives located above the rear circuit board, wherein the plurality of third hard disk drives are electrically connected to the main circuit board via the rear circuit board and coplanar with the first hard disk drives.

2. The server according to claim 1, wherein a plurality of first connectors are mounted on the left circuit board and the right circuit board, respectively, the plurality of first hard disk drives are directly inserted into the first connectors, respectively, along a direction heading toward the main circuit board, a plurality of third connectors are mounted on the left side and the right side of the rear circuit board, respectively, and the plurality of second hard disk drives are directly inserted into the third connectors, respectively, along a direction heading toward the rear circuit board.

3. The server according to claim 2, wherein a plurality of fifth connectors are mounted on the rear circuit board, the plurality of the fifth connectors are arranged in a line and located at the left side or the right side of the rear circuit board, the plurality of third hard disk drives are directly inserted into the plurality of fifth connectors, respectively.

4. The server according to claim 3, wherein when the plurality of fifth connectors are located at the left side of the rear circuit board, the plurality of fifth connectors and the plurality of third connectors are staggered at the left side of the rear circuit board, and when the plurality of the fifth connectors is located at the right side of the rear circuit board, the plurality of fifth connectors and the plurality of third connectors are staggered at the right side of the rear circuit board.

5. The server according to claim 3, wherein the plurality of first connectors are mounted on an upper surface of the left circuit board, the plurality of third connectors are mounted on an upper surface of the right circuit board, and the plurality of fifth connectors are mounted on an upper surface of the rear circuit board, wherein the upper surface of the left circuit board, the upper surface of the right circuit board and the upper surface of the rear circuit board are coplanar with each other, and the plurality of first connectors, the plurality of third connectors and the plurality of fifth connectors are located at the same horizontal height, and wherein the plurality of first hard disk drives, the plurality of second hard disk drives and the plurality of third hard disk drives are located at the same horizontal height.

6. The server according to claim 5, wherein the first connectors located on the left circuit board and the third connectors located at the left side of the rear circuit board are arranged in line, and the first connectors located on the right circuit board and the third connectors located at the right side of the rear circuit board are arranged in line.

7. The server according to claim 1, further comprising a rack having a rear side, wherein a number of the at least one server host is plural, each tray comprises a first carrier and a second carrier, the plurality of first carriers are locked in the rack and divide an inner space of the rack into a plurality of rooms, and the second carrier is slidably mounted on the first carrier.

8. The server according to claim 7, wherein the tray further comprises a pivotal cable management comprising a plurality of cable management rods pivotally connected in series, an end of the pivotal cable management is pivotally located on the first carrier, and another end of the pivotal cable management is pivotally located on the second carrier, the second carrier is adapted for being slidably moved relative to the first carrier to drive the plurality of cable management rods relatively open or close, and the server host further comprises an adapter circuit board, at least one data and signal transmission cable and at least one power cable, wherein the adapter circuit board is mounted on a side of the first carrier near the rear side of the rack, wherein the data and signal transmission cable and the power cable are secured to the plurality of cable management rods, and the two opposite ends of the data and signal transmission cable and opposite ends of the power cable are electrically connected to the rear circuit board and the adapter circuit board, respectively, wherein, when the second carrier is pulled from the first carrier, the data and signal transmission cable and the power cable are expanded according to an expansion of the pivotal cable management making signal transmissions through the data and signal transmission cable and the power cable uninterruptible, wherein the plurality of first hard disk drives, the plurality of second hard disk drives and the plurality of third hard disk drives are plug-and-play.

9. The server according to claim 7, wherein each of the server hosts further comprises two cable managements and at least one network cable, the two cable managements are pivotally located at the front side of the second carrier, and the network cable is electrically connected to the main circuit board, wherein, when the second carrier is located in the first carrier, the network cable is wound around the two cable managements, wherein, when the first carrier is pulled out from the second carrier, the network cable being wound around the two cable managements is expanded, wherein, when the second carrier of an upper one of two of the server hosts adjacent to each other is located in the first carrier and the second carrier of a lower one of the two adjacent server hosts is pulled out from the first carrier of the lower one of the two adjacent server hosts, the two cable managements of the upper one of the two adjacent server hosts are located above two of the second hard disk drives of the lower one of the two adjacent server hosts, and the two cable managements of the lower one of the two adjacent server hosts are adapted for being flipped upwards, wherein the two cable managements of the upper one of two adjacent server hosts do not interfere with the assembly and disassembly of the two of the second hard disk drives of the lower one of the two adjacent server hosts.

10. The server according to claim 1, wherein the main circuit board comprises a slot connector, and the rear circuit board comprises a metal pin connector, and the metal pin connector is adapted for being inserted in the slot connector, wherein the main circuit board is electrically connected to the rear circuit board.

11. The server according to claim 1, wherein the server host further comprises a plurality of hard disk drive carriers for carrying the plurality of third hard disks drives, each of the carrier comprises a plurality of assembly portions corresponding to the plurality of hard disk drive carriers, and the plurality of hard disk drive carriers each are mounted on the assembly portions, wherein each of the plurality of hard disk drive carriers comprises a supporting frame and a cover pivotally located on the supporting frame, each supporting frame includes a plurality of assembly slots, each assembly portion includes a plurality of assembly protrusions for being slidably moved relative to the plurality of assembly slots, the rear circuit board includes a plurality of openings, and the plurality of assembly protrusions of the plurality of assembly portions pass through the plurality of openings and are higher than the rear circuit board.

* * * * *